(12) United States Patent
Shepherd et al.

(10) Patent No.: US 8,643,523 B1
(45) Date of Patent: Feb. 4, 2014

(54) SHARING EMBEDDED ADC RESOURCES ACROSS HARDWARE AND SOFTWARE SAMPLE-CONVERSION QUEUES WITH IMPROVED AVAILABILITY OF THE RESOURCES

(75) Inventors: Thomas J. Shepherd, McKinney, TX (US); Vijaya B P Sarathy, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/591,997

(22) Filed: Aug. 22, 2012

(51) Int. Cl.
*H03M 1/00* (2006.01)
(52) U.S. Cl.
USPC .......................................... 341/141; 341/155

(58) Field of Classification Search
USPC .................................................. 341/155, 141
See application file for complete search history.

(56) References Cited

U.S. PATENT DOCUMENTS

| 7,106,235 | B1 * | 9/2006 | Yen et al. ...................... 341/144 |
| 2008/0297384 | A1 * | 12/2008 | McMahon et al. ............. 341/141 |
| 2011/0234439 | A1 * | 9/2011 | Nishi ............................ 341/155 |

* cited by examiner

*Primary Examiner* — Jean B Jeanglaude
(74) *Attorney, Agent, or Firm* — John R. Pessetto; Wade J. Brady, III; Frederick J. Telecky, Jr.

(57) ABSTRACT

An apparatus for sharing embedded analog-to-digital conversion resources across multiple hardware and software sample conversation queues includes an analog front end, a least one FIFO buffer, a plurality of configuration registers and a sequencer. The sequencer admits a higher priority hardware stepping sequence until the higher priority stepping sequence is completed. After completion, the apparatus reverts to completing pending conversions.

20 Claims, 6 Drawing Sheets

SHARING EMBEDDED ADC RESOURCES ACROSS HARDWARE AND SOFTWARE SAMPLE-CONVERSION QUEUES WITH IMPROVED AVAILABILITY OF THE RESOURCES

TECHNICAL FIELD

This disclosure relates generally to analog-to-digital converters (ADCs). More specifically, this disclosure relates to improving availability of embedded ADC resources across multiple hardware and software sample conversion queues deployed in real time applications.

BACKGROUND

Many embedded system on a chip (SoC) solutions integrate large number and types of functions to minimize overall costs. One example is an integrated on-chip touch screen controller/analog-to-digital converter (ADC) on, for example, a multi-function, network or stand-alone processor. The ADC conversion circuitry within such SoC usually uses a significant portion of the overall component area and typically consumes the most power. Accordingly, this motivates the need to share the ADC across multiple hardware and software conversion demands.

Sharing resources in a time-critical embedded application places increased demands on meeting system timing without undue degradation of overall system responsiveness. One such example of a time-critical embedded application is networked motion control/drives that continue to push for minimal packet jitter and latencies. Remote nodes must be able to plan, coordinate, communicate and affect plant-updates quickly and precisely during each such operating-cycle.

BRIEF DESCRIPTION OF DRAWINGS

For a more complete understanding of this disclosure and its features, reference is now made to the following description, taken in conjunction with the accompanying drawings, in which.

DETAILED DESCRIPTION

The FIGURES and text below, and the various embodiments used to describe the principles of the present invention are by way of illustration only and are not to be construed in any way to limit the scope of the invention. A Person Having Ordinary Skill in the Art (PHOSITA) will readily recognize that the principles of the present invention maybe implemented in any type of suitably arranged device or system. Specifically, while the present invention is described with respect to use in a multimedia processor with touch screen controller capabilities, a PHOSITA will readily recognize other system on chip (SoC) uses and other ADC applications without departing from the scope of the present invention.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise", as well as derivatives thereof, mean inclusion without limitation. The term "or" is inclusive, meaning and/or. The phrase "associated with", as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of", when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Figure 1:
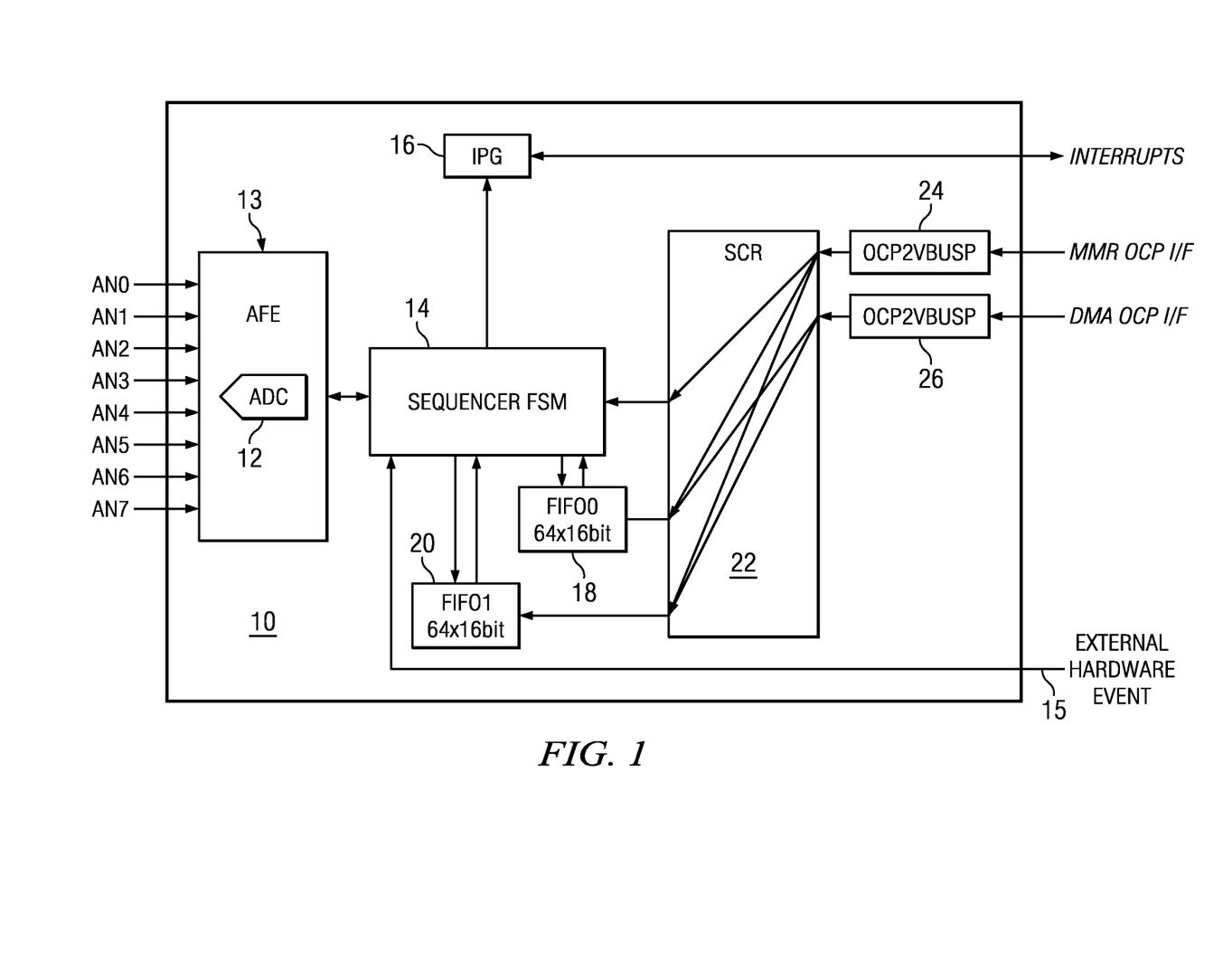
FIG. 1 is a general block diagram of an analog-to-digital converter (ADC) subsystem that can be used with a touch screen controller in a multimedia processor, in accordance with the principles of the present invention.

Reference is now made to FIG. 1 that depicts a functional block diagram of an analog-to-digital converter (ADC) subsystem 10 for use in a particular system on a chip (SoC) application namely, a multimedia processor with touch screen controller support, for which the present invention has application. A PHOSITA will readily recognize many other SoC designs and other applications for which the present invention is utilized without departing from the scope and spirit of this disclosure.

The ADC subsystem 10 comprises an AFE 13 preferably having at least an eight channel Analog-to-digital Converter (ADC) 12 coupled to analog inputs AN0-AN7, a finite state machine (FSM) sequencer 14, an Interrupt Program Generator 16, a first FIFO buffer 18, a second FIFO buffer 20, step configuration registers 22, a first OCP2VBUSP 24 and a second OCP2VBUSP 26.

The blocks OCP2VBUSP 24 and OCP2VBUSp 26 "bridge" the bus-protocol the SCR (Switched Central Resource which is an implementation of VBUS protocol) with the bus-protocol MMR OCP I/F and DMA OCP I/F. These blocks (i.e. bridges) are often used when the SoC is integrating multiple components that publish or support dissimilar interface ports. The OCP and VBUSP buses in this case are dissimilar and therefore need some transpose logic to bridge between the two buses. The blocks OCP2VBUSP 24 and OCP2VBUSp 26 provide the necessary transpose logic between the two buses.

The sequencer 14 is coupled to an external hardware event interrupt line 15, the AFE 13, the interrupt program generator 16, first FIFO buffer 18, second FIFO buffer 20, and step configuration registers 22. As described in more detail below, the sequencer 14 behavior is adjusted by programming the step configuration registers 22.

Figure 2:
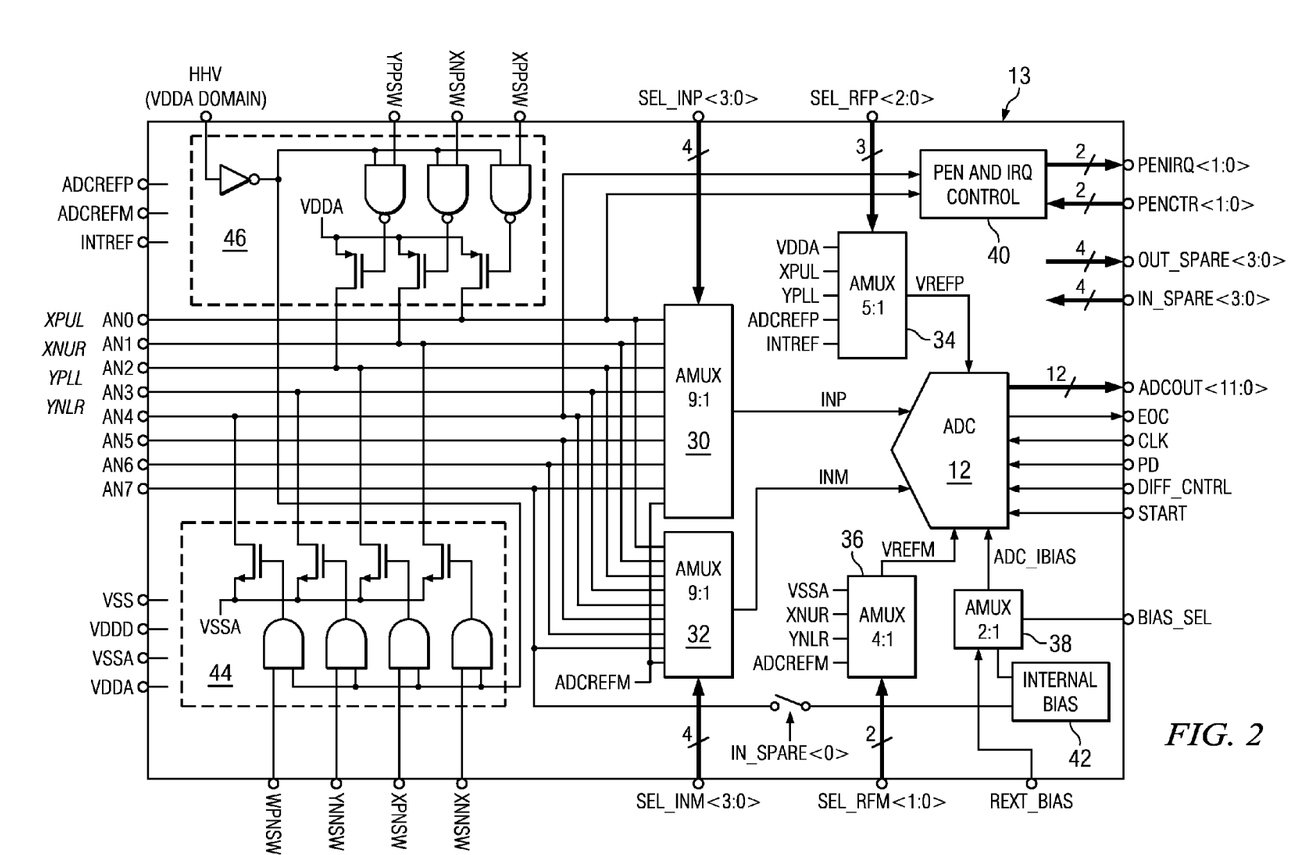
FIG. 2 is a block diagram of an analog front end (AFE) of the ADC system depicted in FIG. 1.

Reference is now made to FIG. 2 that depicts a block diagram of the Analog Front End 13, practiced in accordance with the present invention. AFE 13 comprises ADC 12, a first and second 9:1 analog multiplexer 30 and 32 respectively, a 5:1 analog multiplexer 34, a 4:1 analog multiplexer 36, a 2:1 analog multiplexer 38, Pen and interrupt control logic 40, internal bias generator 42, pull-down transistors and logic 44 and pull-up transistors and logic 46. Analog input channels AN0-AN7 are coupled to pull-down and pull-up circuitries 44 and 46 and to the first and second 9:1 analog multiplexers 30 and 32.

As used in this DETAILED DESCRIPTION section, the term "step" is used to describe which input values (i.e. channels) are sent to the AFE 13, how a value is sent, when and which channel AN0-AN7 to sample. There are preferably ten programmable steps (i.e. Idle Step, Steps 1-8, and PreIdle Step). The step configuration registers 22 include StepEnable, StepConfig, and StepDelay registers for each step (channel). The StepEnable register enables or disables a particular step. Various control inputs depicted in FIG. 2 are coupled to the StepConfig register outputs for controlling reference voltages, the pull up/down transistor biasing circuitries 44 and 46 to the ADC 12, the analog multiplexers 30 and 32, whether hardware or software synchronizes, averaging, and which FIFO 18 or 20 to save the data. The StepDelay register controls the time between driving the analog inputs AN0-AN7 to the AFE 13 and the time from when the SOC signal to the AFE 13 is sent (i.e. the time between the rising edge and falling edge of the SOC signal (See FIG. 4).

Figure 3A:
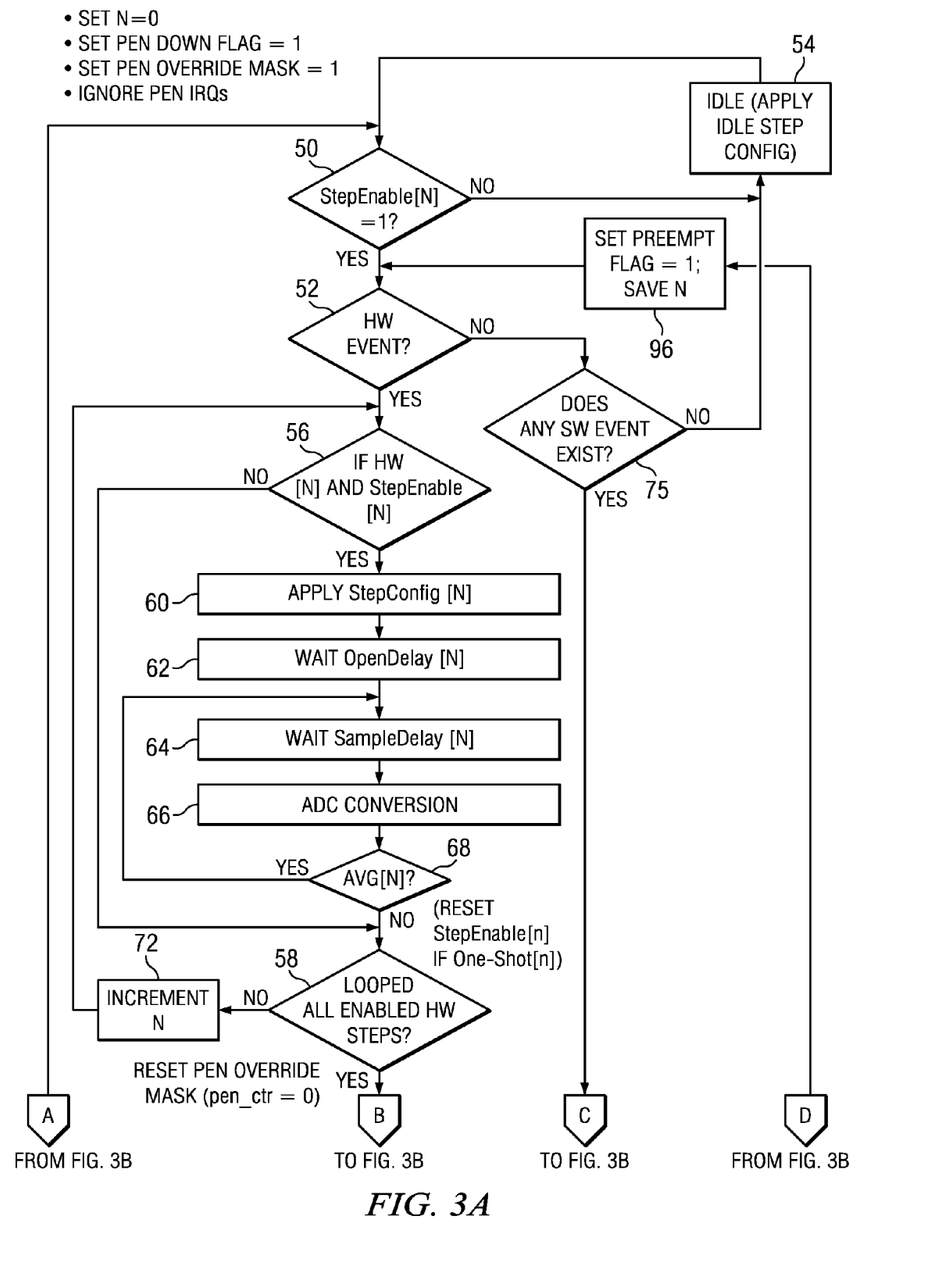
FIG. 3A is a flow diagram of the ADC conversion queue logic for the sequencer depicted in FIG. 1, in accordance with the principles of the present invention; and, FIG. 3B is a flow diagram of the ADC conversion queue logic for the sequencer depicted in FIG. 1, in accordance with the principles of the present invention; and, FIG. 4 depicts a timing diagram for the sequencer depicted in FIG. 1, in accordance with the principles of the present invention.

Referring to FIG. 3A, when the subsystem 10 is first enabled, the sequencer 14 starts in the Idle sequence 54 and then waits for a StepEnable[n] bit to turn on at decision sequence 50. At decision sequence 50, the sequencer 14 determines if a particular step (i.e. channel) is enabled. If a step is disabled, then the sequencer 14 skips to the next step. If all steps are disabled, then the sequencer 14 remains in the IDLE state and continues to apply the Idle StepConfig settings. After a step is enabled, the sequencer 14 starts with the lowest step (Channel/step1) and continues until Channel/step8. If the channel is enabled, the sequencer 14 then determines at decision sequence 52 if the step is a hardware or a software event.

Hardware synchronized steps are always scheduled before software enabled steps. In a touch screen only mode (no general-purpose channels), the steps are configured as hardware synchronized triggered events (i.e. mapped to a pen event). The sequencer 14 waits in an IDLE state 54 until a hardware pen down event occurs and then the sequencer 14 sequences through the various hardware step conversions. A Touch Screen Charge step occurs in sequence 70 after the last hardware step before going back to the Idle state. The Touch Screen Charge sequence charges touch screen capacitance to allow the controller to detect subsequent Pen touch events. Assuming a mixed mode application (touch screen and general-purpose channels), the steps/channels can be configured as either hardware triggered (mapped to pen event) or software enabled. If the sequencer 14 is in the IDLE state 54, and a hardware pen event occurs, then the hardware steps (from lowest to highest) are scheduled first, followed by the Touch Screen Charge sequence. If there is no hardware event, then the software-enabled steps are scheduled.

If a hardware event occurs while the sequencer 14 is in the middle of scheduling the software steps, the user can program the sequencer 14 to allow preemption. If the hardware preempt control bit is enabled at sequence 92 (FIG. 3B), the sequencer 14 permits the current software step to finish and then schedules the hardware steps. After the last hardware step and Touch Screen Charge step are completed, the sequencer 14 will continue from the next software step (before the preemption occurred). If the hardware preemption is disabled at sequence 92 (FIG. 3B), the touch event will be ignored until the last software step is completed.

Even if a touch screen is not present, steps (Channels) 1-8 can be configured to be hardware synchronized by mapping to the hardware event input signal 15 (FIG. 1). This hardware event input signal 15 can be driven at the SoC level from one of many (typically multiplexor selectable) causal trigger signals. For example, ADC conversion can be configured to auto-initiate at an occurrence of an SoC internal high-resolution timer-expiry event or assertion of an embedded EtherCAT slave's process-watchdog-expiry event or node synchronization signals (e.g. SYNC0/1). When mapping is set for the input hardware event signal 15, the subsystem 10 waits for a rising edge transition (from low to high). END_OF_SEQUENCE and the PEN_UP interrupts are generated after the last active step is completed at sequence 90 before going back to the IDLE state 54. The END_OF_SEQUENCE interrupt does not mean data is in FIFO 18 or 20.

A Pen interrupt can occur if the correct Pen Ctr bits <1:0> are high and if the correct ground transistor biasing is set in the StepConfig [N] Register in step configuration registers 22. If a step is configured as hardware synchronized, the sequencer 14 will override the Pen Ctr bits <1:0> once it transitions from the Idle sequence 54. The sequencer 14 will automatically mask the Pen Ctr bits <1:0> (override them and turn them off) so that the ADC 12 can get an accurate measurement from the x and y channels. After the last hardware synchronized step, the sequencer 14 will go to the Touch Screen Charge sequence 70 (FIG. 3B) and the pen_overide mask is removed and the values set by Pen Ctr bits <1:0>. The Pen interrupt will be temporarily ignored during the Touch Screen Charge sequence (hardware will mask any potential glitch that may occur)

If the sequencer 14 is not using the hardware synchronized approach, (all the steps are configured as software enabled), then it is the user's responsibility to correctly turn on and off the Pen Ctr bits <1:0> to the AFE 13 in order get the correct measures from the touch screen. It is also possible to detect the hardware Pen event even if all the StepEnable[n] bits are off by setting the Pen Ctr bit to 1, and configuring the IdleStep Configuration register to correctly bias the transistor to ground, the HW_PEN event will be generated.

The following interrupts are maskable via enable bits. A Pen down interrupt is generated when a user touches the screen. A Pen up interrupt is generated after the sequencer 14 detects that the pen is lifted. An END_OF_SEQUENCE interrupt is generated after the last active step. Each FIFO 18 and 20 has an underflow or overrun interrupt. Each FIFO 18 and 20 has a programmable threshold interrupt. An out of range interrupt is generated if sampled data is greater than programmable value, or less than a programmable value. Each FIFO 18 and 20 is serviced by either DMA or CPU access. To generate DMA requests, a register in step configuration registers 22 is enabled. A value for the desired number of words needed to generate a DMA request is also programmable in the step configuration registers 22. A DMA request is generated when a level in FIFO 18 or 20 reaches or exceeds that value. A DMA slave port allows for burst reads to effectively move the data out of FIFO 18 or 20.

Internally, the most significant bits of the DMA address are decoded for either FIFO 18 or FIFO 20. The lower bits of the DMA address are ignored since pointers in FIFO 18 and 20 are internally incremented.

The ADC subsystem 10 has eleven internal events that can trigger an interrupt as described in more detail below. These events are logically OR'ed together to send just one output interrupt to the host processor[s] on the SoC. The interrupt sources are enabled by programming an Interrupt Enable Register in the step configuration registers 22. Once the interrupt is generated, an interrupt status register in the step configuration registers 22 can be read to find the interrupt source, and can be cleared by writing to the correct status bit location. The interrupts are also maskable.

The hardware Pen (Touch) interrupt is generated when a user presses the touch screen. This occurs if one of the Pen Ctrl bits <1:0> is enabled and the correct setting for a path to ground is set in the step configuration registers 22. Although the hardware Pen interrupt can be disabled, the event will still trigger the sequencer 14 to start if the step is configured as a hardware synchronized event. The hardware Pen interrupt is an asynchronous event and can be used even if the subsystem 10 clocks are disabled. The hardware Pen interrupt can be used to wake up the rest of the SoC.

An END_OF_SEQUENCE interrupt is generated after the sequencer 14 finishes servicing the last enabled step. A PEN_UP interrupt is generated if the hardware steps are used and the Charge sequence is enabled. If a pen down event caused the hardware steps to be scheduled, and after the sequencer 14 finishes servicing the charge sequence, if the hardware Pen (touch) is not active then a PEN_UP interrupt is generated.

FIFOs 18 and 20 have support for generating interrupts when the FIFO word count has reached a programmable threshold level. The registers are programmable to the desired word count at which the CPU should be interrupted to read the FIFO. Whenever the threshold counter value is reached, it sets the FIFO threshold interrupt flag, and the CPU is interrupted if the FIFO THRESHOLD interrupt enable bit is set. The CPU clears the interrupt flag, after emptying the FIFO, by writing a '1' to the FIFO threshold interrupt status bit.

To determine how many samples are currently in FIFOs 18 or 20 at a given moment, the FIFO word count register in the step configuration registers 22 can be read by the CPU. The FIFO 18 or 20 can also generate FIFO overrun and FIFO underflow interrupts. The user can mask these events by programming the enable bits in the step configuration registers 22. To clear a FIFO underflow or FIFO overrun interrupt, a user writes to the status bit.

The ADC subsystem 10 has a dedicated DMA slave port to allow for continuous DMA burst reads to access the FIFO 18 and 20. The first DMA request is generated after FIFO 18 or 20 leave the EMPTY state and reaches the desired data level (programmed in a DMA REQUEST LEVEL register in step configuration registers 22). Subsequently, if the FIFO 18 or 20 contains enough data, a new DMA request is generated after the current DMA access (if the read does not cause the FIFO 18 or 20 to be empty). The DMA request occurs on the next cycle after the previous DMA FIFO read. The CPU can also read from the FIFO 18 or 20 by reading from the FIFO DATA register in step configuration registers 22. Internal logic pops the next data from the FIFO 18 or 20 and increments the internal FIFO read pointers. The most significant bit of the DMA address decodes whether access is to FIFO 18 or FIFO 20. The remaining bits of the DMA address are ignored.

Figure 3B:
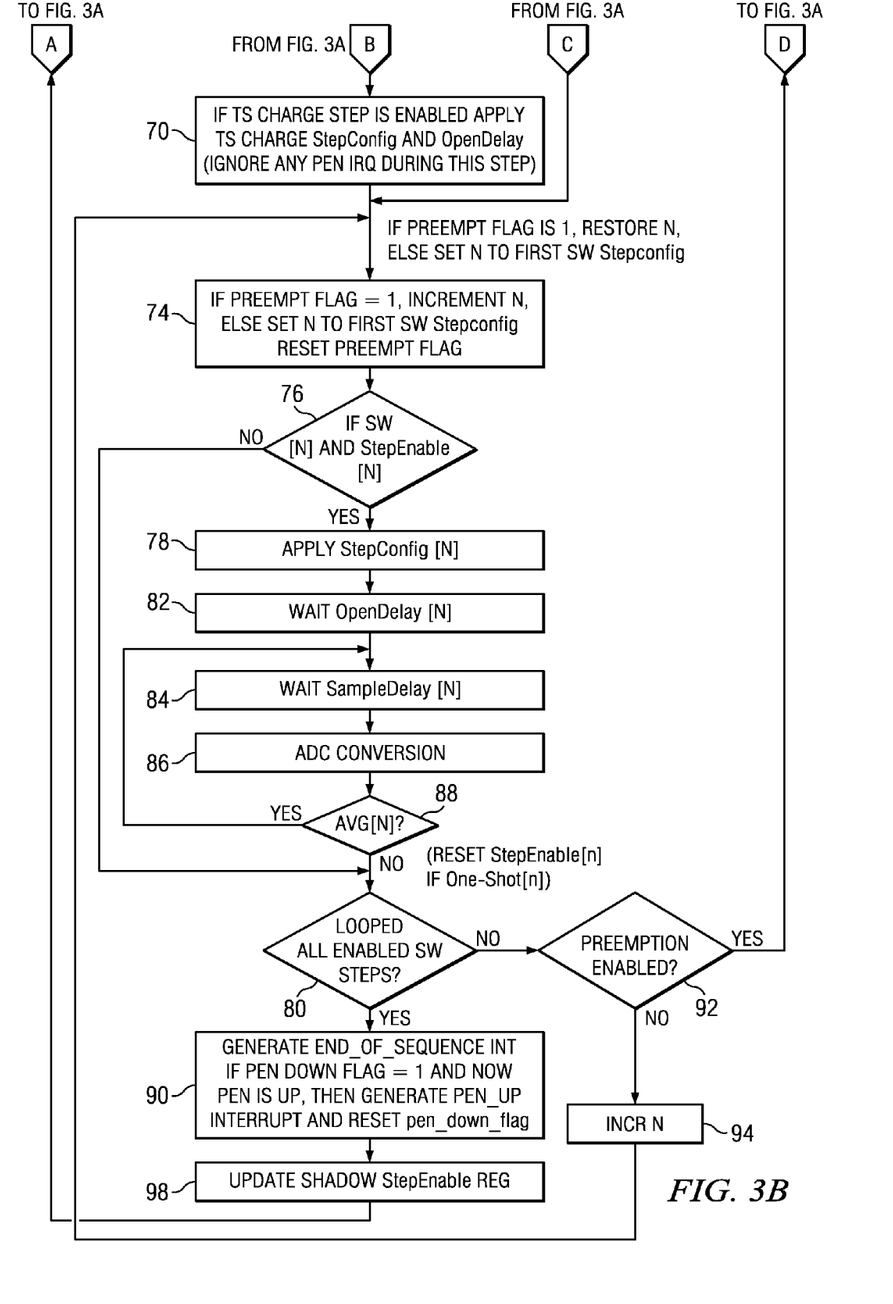

Reference is now made to FIG. 3A and FIG. 3B that depicts the ADC Conversion Queue processing of sequencer 14 with built-in priority/preemption techniques wherein an ongoing stepping sequence can be parked to admit a higher priority hardware stepping sequence. Once the higher priority hardware stepping sequence or conversion is complete, the system will revert to complete the pending conversions without further assistance from the rest of the system/application software. In other words, the preemption scheme is transparent to the software.

When the subsystem 10 is first enabled, the sequencer 14 starts in the Idle sequence 54 and then waits for a StepEnable [n] bit to turn on at decision sequence 50. At decision sequence 50, the sequencer 14 determines if a particular step (i.e. channel) is enabled. If a step is disabled, then the sequencer 14 skips to the next step. If all steps are disabled, then the sequencer 14 remains in the IDLE state and continues to apply the Idle StepConfig settings. After a step is enabled, the sequencer 14 starts with the lowest step (Channel/step1) and continues until Channel/step8. If the channel is enabled, the sequencer 14 then determines at decision sequence 52 if the step is a hardware or a software event.

If at decision sequence 52 it is determined that it is a hardware event, then decision sequence 56 determines whether the hardware and step enable bits are set for a particular channel N. If not, the sequencer 14 flow skips ahead to process sequence 58, otherwise if yes, continues on to process sequence 60. At process sequence 60 the step configuration values stored in step configuration registers 22 are applied and flow is passed to sequence 62. At process sequence 62 the open delay, if any, is applied as described above. At process sequence 64 the sample delay, if any, is applied as described in the sections above and flow is passed to sequence 66.

At process sequence 66, the analog signal on channel N is converted into a digital value and flow is passed to sequence 68. At decision sequence 68, the step configuration registers 22 are read and determined whether to average out multiple samples. If averaging is set, then sequence 64 through 68 are repeated until an average value over a presettable number of samples is calculated and flow is passed to sequence 58.

Decision sequence 58 is executed either after sequence 56 when either the hardware or step enable bits are not set or after process sequence 68. Sequencer 14 flow proceeds to process sequence 70 if all enabled hardware steps are completed. If not, N is incremented at process sequence 72 and decision sequence 56 is repeated. At process sequence 70, the step configuration registers 22 are checked to identify whether the touch screen charge sequence is enabled in step configuration registers 22. If so, then the touch screen charge, Step Config and Open Delay sequences are performed and sequencer 14 flow transfers to process sequence 74.

Returning to decision sequence 52, if it is determined that no hardware event occurred, then decision sequence 75 determines whether any software event occurred. If no software event, then sequencer 14 sequences back into Idle at sequence 54. Otherwise, sequencer 14 flow transfers to process sequence 74.

At process sequence 74, if the preempt flag is set, then N is incremented. If the preempt flag is not set, then N is set to the first software Step Config value stored in the step configuration registers 22 and the Preempt flag is reset. Sequencer 14 then proceeds to decision sequence 76 that determines if a software event occurred and whether Step Enable is set for step N in the step configuration registers 22. If not, the sequencer 14 flow skips ahead to process sequence 80, otherwise if yes, continues on to process sequence 78. At process sequence 78 the step configuration values stored in step configuration registers 22 are applied. At process sequence 82, the open delay, if any, is applied as described in the sections above. At process sequence 84 the sample delay, if any, is applied as described in the sections above.

At process sequence 86, the analog signal on channel N is converted into a digital value. At decision sequence 88, the step configuration registers 22 are read and determined whether to average out multiple samples. If averaging is set, then sequences 84 through 88 are repeated until an average value over a presettable number of samples is calculated. Decision sequence 80 is executed either after sequence 76 when either the software or step enable bits are not set or after process sequence 88. Sequencer 14 flow proceeds to process sequence 90 if all enabled software steps are completed. If all enabled software steps are not completed, then sequencer 14 flow transfers to decision sequence 92 that determines if Preemption is enabled in step configuration registers 22. If not, then process sequence 94 increments N and sequencer 14 flow passes back to sequence 74. If Preemption is detected as being enabled at sequence 92, flow passes to process sequence 96 that sets the Preemption bit and saves the Soft-Step Index/Context, N. Sequencer flow then passes back to decision sequence 52.

Process sequence 90 is executed if all enabled software steps are completed as determined in decision sequence 80. Process sequence 90 generates an END_OF_SEQUENCE interrupt and if the pen down flag is set in step configuration registers 22 and the pen is up, a Pen up interrupt is generated and the pen down flag in step configuration registers 22 is reset. Sequencer 14 flow transfers to process sequence 98 that updates the shadow StepEnable register in step configuration registers 22. Sequencer flow is then transferred back to decision sequence 50.

Figure 4:
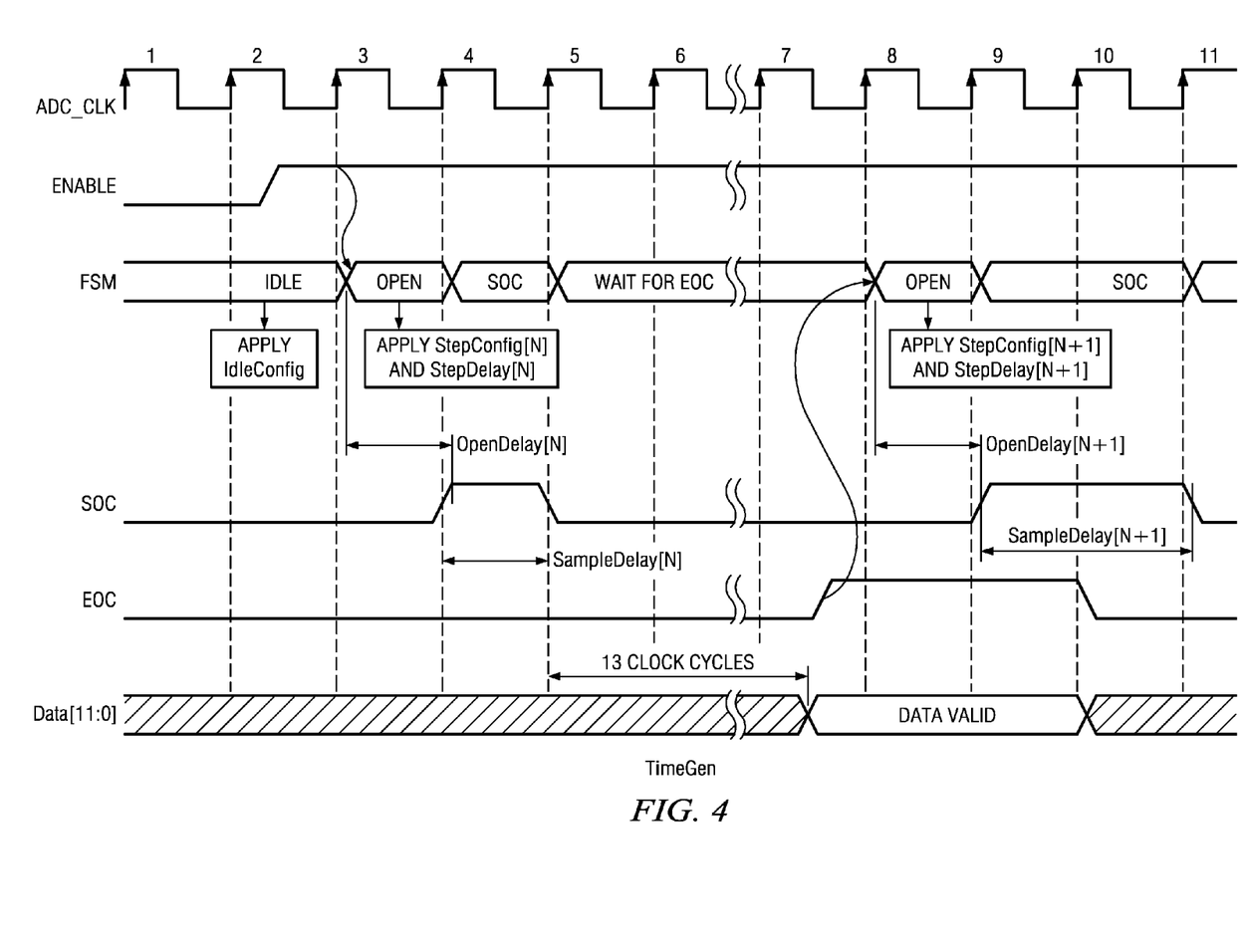

Reference is now made to FIG. 4 that depicts a timing diagram for the sequencer 14 depicted in FIG. 1 in accordance with the principles of the present invention. The timing relationship between the ADC clock; the enable signal; the application of IdleConfig, StepConfig, StepDelay, OpenDelay by the sequencer (FSM) 14; Start of Conversion (SOC) signal, End of Conversion (EOC) signal, and the digital data representative of the ADC conversation is illustrated.

Figure 5:
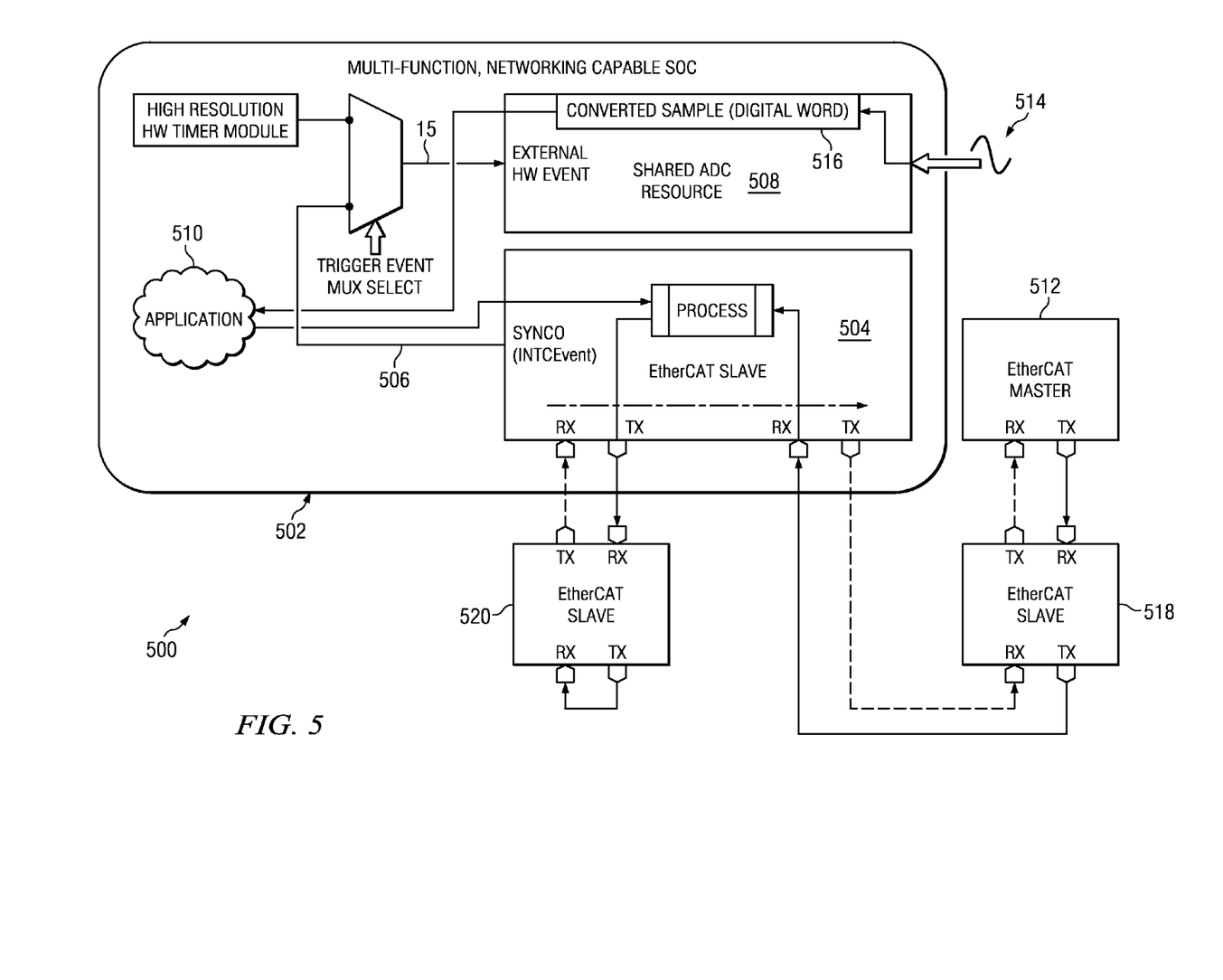
FIG. 5 depicts a block diagram of a system on a chip with an Ether Cat Slave in the context of a distributed control setting in according with the principles of the present invention.

An illustrative but not exhaustive example application of the present invention is shown in FIG. 5. This example of the invention illustrates an SOC 502 running an EtherCat Slave 504 in the context of a distributed-control setting. In this example of the invention, an EtherCat Slave 504 resides on an SOC 502. The EtherCat Slave's signal, SYNC0 506 is routed as an ADC hardware trigger event (15 in FIG. 1). As a result, the shared ADC resource 508 can be commandeered with very high timing precision by a remote EtherCat Master 512 to sample an external analog signal 514 at a time relevant to the networked application 510, convert the sample to a digital value 516 and later publish the result for possible use (or application) inside of one or more downstream EtherCat nodes 520 in the network 500.

The flexibility of the invention to configure assorted causal triggers for ADC conversion within an SoC along with the ability to preempt non-real-time pending conversions to admit a higher priority hardware sample conversion improves the overall jitter performance and determinacy of the system while operating a shared ADC resource.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus for sharing analog to digital conversion resources across multiple hardware and software sample conversation queues comprising:
   (a) an analog front end having a plurality of inputs and an output;
   (b) at least one FIFO buffer;
   (c) a plurality of configuration registers; and,
   (d) a sequencer coupled to the analog front end, the at least one FIFO buffer, and the plurality of configuration registers, wherein an ongoing stepping sequence in the sequencer is parked to admit a higher priority hardware stepping sequence and wherein once a higher priority hardware stepping sequence is complete, the apparatus reverts to complete pending conversions without further assistance.

2. The apparatus of claim 1 further comprising an interrupt program generator coupled to the sequencer.

3. The apparatus of claim 1 wherein the sequencer is coupled to an external hardware event trigger line wherein the external hardware event trigger line allows sample conversion to be time-synchronized to other system events.

4. The apparatus of claim 3 wherein a system event is selected from a group consisting of an on-chip hardware timer and a notification event asserted by an on-chip fieldbus/industrial Ethernet node.

5. The apparatus of claim 1 wherein after the apparatus is initialized, context preemption is done transparently with respect to software running on the apparatus.

6. The apparatus of claim 1 wherein the sequencer is configurable by programming the plurality of configuration registers.

7. The apparatus of claim 1 wherein the analog front end comprises
   (i) an analog-to-digital converter;
   (ii) a plurality of analog multiplexers;
   (iii) interrupt control circuitry; and,
   (iv) pull-down and pull-up circuitry coupled to the plurality of inputs.

8. The apparatus of claim 1 wherein the plurality of configuration registers comprise enable, configure, and delay registers for each channel.

9. The apparatus of claim 1 wherein the plurality of configuration registers includes a preempt control bit wherein the sequencer permits a currently executing step to finish and then schedules hardware steps and wherein after a last hardware step, the sequencer continues from the next software step before preemption occurred.

10. The apparatus of claim 1 further comprising circuitry to generate an interrupt after the last active step.

11. The apparatus of claim 1 further comprising a DMA slave port for burst reads to effectively move data out of the at least one FIFO buffer.

12. The apparatus of claim 1 further comprising a plurality of internal sources logically OR'ed together to trigger a single interrupt wherein the plurality of interrupt sources are enabled by programming a register in the plurality of configuration registers and wherein when an interrupt is generated, an interrupt status register in the plurality of configuration registers is read to identify the interrupt source.

13. The apparatus of claim 1 further comprising circuitry for averaging multiple output values from the analog front end.

14. A method for sharing analog-to-digital conversion resources across multiple hardware and software sample conversation queues comprising steps of:
   (a) converting at least one of a plurality of analog inputs into a digital value;
   (b) storing the at least one digital value in a FIFO buffer
   (c) programming a plurality of configuration registers;
   (d) sequencing a stepping sequence in a sequencer wherein a stepping sequence is parked to admit a higher priority hardware stepping sequence and wherein once a higher priority hardware stepping sequence is complete, reverting to complete pending conversion without further assistance.

15. The method of claim 14 wherein an analog-to-digital conversion is configured to prioritize a causal hardware trigger event above that of all other software analog-to-digital conversions.

16. The method of claim 14 wherein the plurality of configuration registers includes a preempt control bit wherein the sequencer permits a currently executing step to finish and then schedules hardware steps and wherein after a last hardware step, the sequencer continues from the next software step before preemption occurred.

17. The method of claim 14 further comprising a step of generating an interrupt after the last active step.

18. The method of claim 14 further comprising the step of programming the plurality of configuration registers for enabling, configuring, and setting a delay for each of the plurality of channels.

19. The method of claim 14 further comprising a step of charging touch screen capacitance.

20. A method for sharing analog-to-digital conversion resources across multiple hardware and software sample conversation queues comprising steps of:
  (a) converting at least one of a plurality of analog inputs into a digital value;
  (b) storing the at least one digital value in a FIFO buffer
  (c) programming a plurality of configuration registers;
  (d) sequencing a stepping sequence in a sequencer wherein the preemption of a software conversion sequence is independent of the relative priority of hardware or software conversion queues; wherein the preemption of a software conversion sequence is determined by a software system programmer.

* * * * *